(12) United States Patent
Patrissi et al.

(10) Patent No.: US 10,895,606 B1
(45) Date of Patent: Jan. 19, 2021

(54) MULTI-SHORT CIRCUIT MODE ELECTROCHEMICAL CELL TEST METHOD

(71) Applicant: The United States of America as represented by the Secretary of the Navy, Newport, RI (US)

(72) Inventors: Charles J Patrissi, Newport, RI (US); Joseph H Fontaine, North Kingstown, RI (US); Jian Tan, New York, NY (US)

(73) Assignee: The United States of America as represented by the Secretary of the Navy

( * ) Notice: Subject to any disclaimer, the term of this patent is extended or adjusted under 35 U.S.C. 154(b) by 40 days.

(21) Appl. No.: 16/421,636

(22) Filed: May 24, 2019

Related U.S. Application Data

(60) Provisional application No. 62/676,514, filed on May 25, 2018.

(51) Int. Cl.

| | |
|---|---|
| *G01R 31/392* | (2019.01) |
| *G01R 31/385* | (2019.01) |
| *H01M 10/48* | (2006.01) |
| *H01M 10/0525* | (2010.01) |

(52) U.S. Cl.
CPC ......... *G01R 31/392* (2019.01); *G01R 31/386* (2019.01); *H01M 10/0525* (2013.01); *H01M 10/48* (2013.01)

(58) Field of Classification Search
CPC .............. G01R 31/392; G01R 31/386; H01M 10/0525; H01M 10/48
See application file for complete search history.

(56) References Cited

U.S. PATENT DOCUMENTS

| | | | |
|---|---|---|---|
| 5,378,551 A | * | 1/1995 | Meadows ............... H01M 2/16 429/122 |
| 2017/0162845 A1 | * | 6/2017 | Gansemer ............... B60L 50/64 |
| 2018/0254463 A1 | * | 9/2018 | Sundaresan ......... H01M 10/425 |
| 2020/0083572 A1 | * | 3/2020 | Wang .................... G01R 31/386 |

* cited by examiner

*Primary Examiner* — Jay Patidar
(74) *Attorney, Agent, or Firm* — James M. Kasischke; Michael P. Stanley

(57) ABSTRACT

A method for testing an internal short circuits in an electrochemical cell is provided. A transistor is implanted in the cell, and it is electrically connected to a controllable voltage source. The transistor is joined between positive and negative components of the cell. The transistor is maintained at high resistance before start of testing. The voltage source is used to reduce electrical resistance in the transistor to simulate an internal short circuit in the electrochemical cell. Thermal runaway propagation in the cell is measured.

16 Claims, 4 Drawing Sheets

MULTI-SHORT CIRCUIT MODE ELECTROCHEMICAL CELL TEST METHOD

STATEMENT OF GOVERNMENT INTEREST

The invention described herein may be manufactured and used by or for the Government of the United States of America for governmental purposes without the payment of any royalties thereon or therefor.

CROSS REFERENCE TO OTHER PATENT APPLICATIONS

This patent application is with provisional application 62/676,514 filed on 25 May 2018 by the same inventor as this application.

BACKGROUND OF THE INVENTION

(1) Field of the Invention

The present invention is directed to a method for testing the effect of an internal short circuit in an electrochemical cell.

(2) Description of the Prior Art

A practical and repeatable method for initiating thermal runaway in Li-ion battery cells is a critical step for proving that improved battery designs are more resistant to thermal runaway propagation and for testing methods being developed to quench thermal runaway. Li-ion battery cells contain high energy electrode materials (i.e., fuel and oxidizer) as well as combustible solvents, salts, and polymers that are stable at normal working temperatures. However, high temperatures can initiate any of several decomposition reactions in the cell creating heat. If the heat cannot be removed fast enough, the thermal feedback can exponentially increase the rate of the reactions causing the chemical energy of the battery to be rapidly, almost instantaneously, released as heat. This "thermal runaway" event can result in the evolution of toxic smoke, fire, and possibly explosion of the battery cell. Large format batteries typically consist of building blocks called modules. The cells within a module are arranged in series and parallel according to the voltage and power requirements of the application. In modules, the cells are tightly packed to save space. Dense packing creates the risk that a single thermal runaway event will propagate through the cells in a module and adjacent modules, engulfing the entire battery. Propagation resistance is critical for manned vehicle batteries and batteries stored on such vehicles. This is particularly true of batteries used in contained areas, such as submarines or spacecraft. Under these conditions a battery fire with its intense heat and smoke could compromise the integrity of the platform and the safety of the crew. This is also true where egress is limited by the mobility of adjacent population as, for example, in hospitals.

There are a number of methods being used to drive lithium ion cells into thermal runaway. National Renewable Energy Lab (NREL) and NASA have partnered to develop an implantable internal short circuit. In their method a copper/aluminum disk is placed between the anode and cathode in a lithium ion battery cell. The disk is electrically isolated from the electrodes by a thin layer of wax. Heat is applied to liquefy the wax which wicks into the porous separator. Subsequently, the bare copper and aluminum disks provide a direct electrical connection between the anode and cathode, i.e., an internal short circuit. The resulting high current and power can create a local hot spot that can start the decomposition reactions and cascade into thermal runaway causing the cell to vent hot gases and burst into flames.

The drawbacks of this method are that this internal short circuit is limited to the low resistance path of the copper and aluminum disks and the requirement for heat to initiate the short circuit. Heat application required to activate the implantable short circuit complicates interpretation of the results because it raises the temperature of the trigger cell and surrounding cells, making them less resistant to thermal runaway and propagation. Another complication is that this type of implantable short circuit doesn't accurately simulate the way short circuits form in lithium ion batteries. Short circuits are latent defects that change resistance over a number of charge and discharge cycles. Thus the severity, or resistance, of the short circuit cannot be investigated using this technique. Also, this method doesn't allow resistance control in an effort to develop detection methods for nascent short circuits. Finally, the effect of low temperature on the severity of thermal runaway cannot be investigated using this method because the trigger cell must be heated.

In operational circumstances, one of the paths to an internal short circuit is believed to start with small metal particles that are left over from the manufacturing process. They can dissolve at the cathode due to high voltage. The resulting metal ions subsequently plate at the anode and the deposit grows back to the cathode causing an internal short circuit. The short may be a "hard" short with low resistance that supports high current and develops into thermal runaway or it may be a "soft" short with high resistance and low current that is manifested by lower than normal cell voltage.

Implanting metal particles in the cell under test has been used to simulate this operational failure. The cell is disassembled by unwinding the rolled electrode, electrolyte structure or "jelly roll" of the cell. Metal particles are implanted by placing a metal particle in contact with the cathode or cathode current collector, rewinding the jelly roll, and sealing the jelly roll back into the can. Results from this testing show that a short circuit forms over a number of charge discharge cycles.

The metal particle implantation method provides a latent defect that develops into short circuit of varying severity. This is considered to more accurately represent a real world short circuit than the NREL/NASA method. This method does not allow control of the implantable short circuit resistance, the severity of the short, or the temperature of the trigger cell.

Another type of thermally activated implantable short circuit has been developed by Tsinghua University and the University of Michigan. A shape memory alloy is deformed while in a low temperature crystal phase allowing memory of the original shape when heated. The device is flat at low temperature when placed against the carbon anode in a lithium ion jelly roll. At increased temperature, the device flexes, piercing the separator and making contact with the cathode, causing an internal short circuit. The results using this method are reported to be reliable and repeatable and cause the cell to go into thermal runaway at high states of charge. As with the NREL/NASA method, heat is required to drive the shape change. Like the NREL/NASA method, this method doesn't allow control of the implantable short circuit resistance.

FIG. 1 shows a cross section of the electrode structure inside a lithium ion battery cell 10. It has become common to use the word "battery" to refer to a single galvanic cell with one pair of negative and positive electrodes; however, the term battery more typically refers to multiple cells in a series and/or parallel arrangement. The electrode structure in a single battery cell is usually made as a sheet. This sheet is sufficiently flexible enough to be wound into a cylindrical "jelly roll." Other shapes such as pouch and prismatic cells are also possible. Assembly is complete once the cell is filled with liquid electrolyte. Cell 10 includes a positive collector 12 and a negative collector 14. In a common lithium ion cell, positive collector 12 is made from aluminum. Negative collector 14 is made from copper. Positive collector 12 is in contact with a positive active layer 16, and negative collector 14 is in contact with a negative active layer 18. A separator 20 is positioned between positive active layer 16 and negative active layer 18. Separator 20 is typically porous and filled with an electrolyte. A positive terminal or tab 22 is joined to positive collector 12, and a negative terminal or tab 24 is joined to negative collector 14.

Four types of internal short circuits can be created by bridging the anode and cathode layers of cell 10 as shown in FIG. 1. Type I is positive active layer 16 to negative active layer 18. Type II is positive collector 12 to negative active layer 18. In a type III internal short circuit, negative collector 14 is bridged to positive active layer 16. In type IV, positive collector 12 is connected to negative collector 14.

Prior art research has determined that there are three factors that affect the severity of thermal runaway. They are the resistance of the short circuit, type of the short circuit, and the temperature of the trigger cell. The methods developed to date have succeeded with controlling the type of the short circuit but not its resistance. In addition, they also require the trigger cell to be heated which increases thermal runaway severity and probability. Tests to date utilizing highly conductive short circuits have shown that the type II internal short circuit results in significant heat generation and thermal runaway while the other types of internal short circuits will affect cell performance but don't always lead to thermal runaway.

Accordingly, there is a need for a method for investigating thermal runaway that allows variable resistance at a short circuit location and does not require the application of external heat.

SUMMARY OF THE INVENTION

It is a first object of the present invention to provide a method for investigating internal short circuits in an electrochemical cell.

Another object is to provide a method that can simulate internal short circuits having different resistance levels in a cell.

Accordingly, there is provided a method for testing internal short circuits in an electrochemical cell. A transistor is implanted in the cell, and it is electrically connected to a controllable voltage source. The transistor is joined between positive and negative components of the cell. The transistor is maintained at high resistance before start of testing. The voltage source is used to reduce electrical resistance in the transistor to simulate an internal short circuit in the electrochemical cell. Thermal runaway propagation in the cell is measured.

BRIEF DESCRIPTION OF THE DRAWINGS

Reference is made to the accompanying drawings in which are shown an illustrative embodiment of the invention, wherein corresponding reference characters indicate corresponding parts, and wherein.

DETAILED DESCRIPTION OF THE INVENTION

Figure 1:
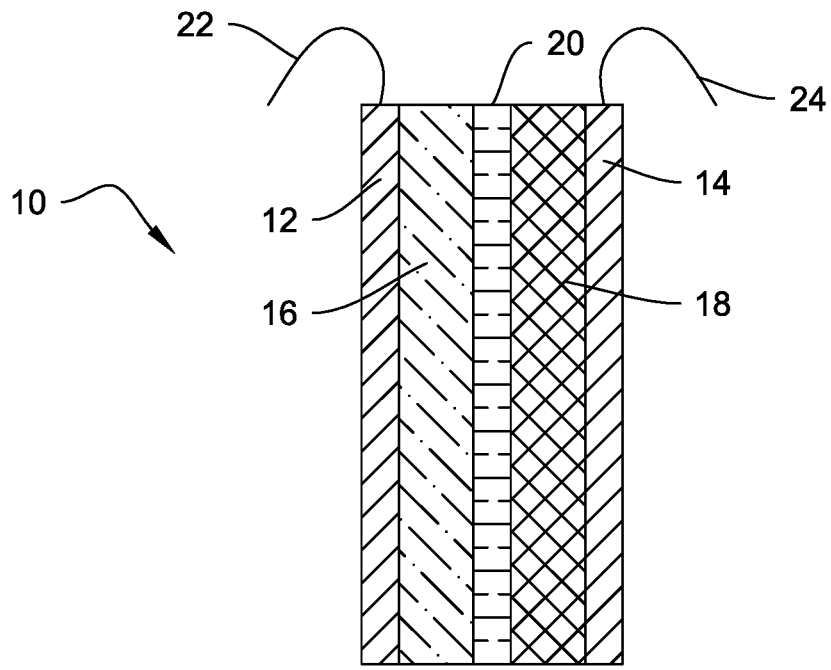
FIG. 1 is a cross-sectional view of a prior art Li-ion cell.
Figure 2:
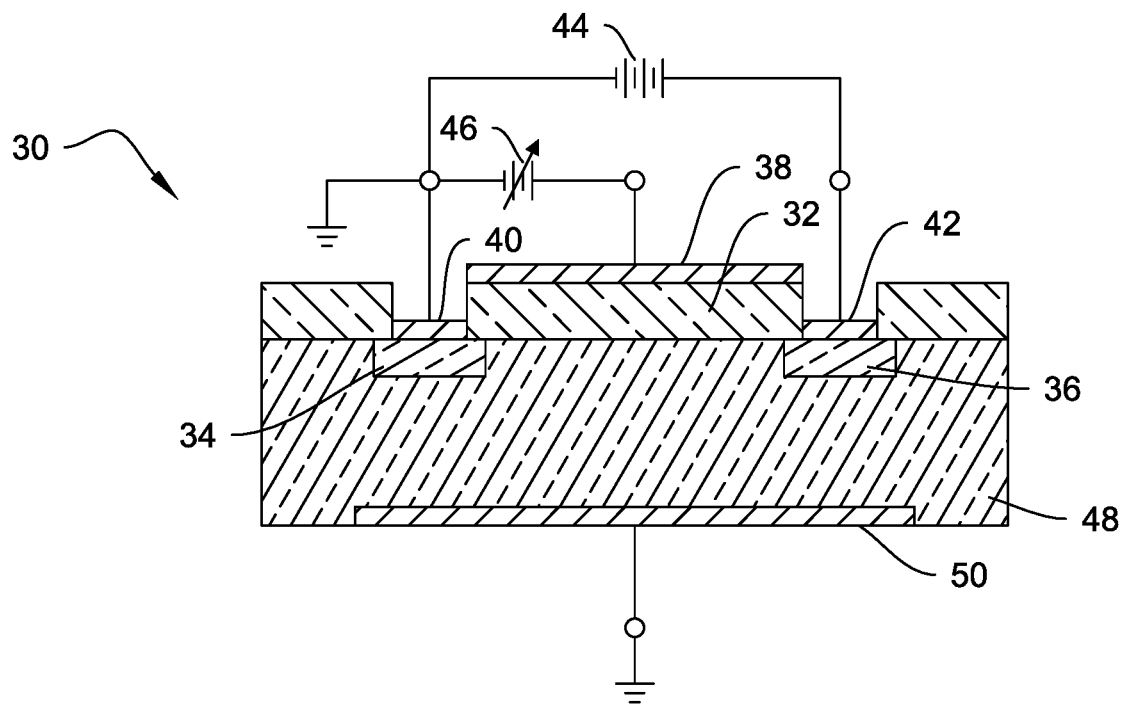
FIG. 2 is a cross-sectional view of an N-channel metal oxide semiconductor field effect transistor MOSFET.

An embodiment of the method herein utilizes a micro-size electronic switch implanted inside the electrode structure of a lithium ion battery cell in order to test these cells. A metal oxide semiconductor field effect transistor (MOSFET) is preferred as the electronic switch. FIG. 2 shows the critical elements of an N-Channel MOSFET 30 and the operating principles. MOSFET 30 has a gate electrode 38, separated from the body 48 by a dielectric 32. The source 40 and drain 42 electrodes are connected to N+ regions, 34 and 36 respectively, within the p-doped body 48. Electron current from battery under test 44 flows between the source electrode 40 and drain electrode 42 while the resistance between them is controlled by a controllable voltage source 46 applied to gate electrode 38 and source electrode 40. Source 34 and drain 36 are N+ regions joined to source electrode 40 and drain electrode 42. These N+ regions have an excess of negative charge carriers (electrons). The p-type silicon used as the base 48 of the MOSFET has a deficit of electrons. A base electrode 50 may be included. Base electrode 50 is joined to the same ground as source electrode 40.

Gate electrode 38 voltage affects resistance in the channel between source 34 and drain 36. At zero applied gate voltage, the channel between the N+ regions is highly resistive so no current can flow between the source electrode 40 and drain electrode 42. As voltage source 46 is made more positive, negative charges in the p-type body region 48 are attracted to the channel where they are trapped by the silicon dioxide dielectric. P-type body region 48 can have a base electrode 50 for biasing. The magnitude of the gate voltage provided by voltage source 46 controls the concentration of charge carriers in the channel and, so, the resistance through the channel. MOSFET resistance in the "fully on" state can be as low as a few milliohms.

Fully on gate voltage from source 46 results in maximum current traveling through p-type region 48. Heating is governed by the equation $P=I^2R$ where P is power in watts, I is current in amperes, and R is resistance in ohms. A MOSFET implanted as a type 2 implanted short circuit will rapidly generate significant $I^2R$ heat in its low resistance state. Maximum $I^2R$ heating will occur when implanted short circuit resistance matches cell resistance. Current between source 34 and drain 36 increases linearly when resistance is decreased. Power is dependent on current squared so a linear decrease in resistance will result in higher power and generated heat. The minimum operating resistance is the cell resistance. This will define the maximum possible current through the MOSFET.

The resulting intense localized heating in the MOSFET and area around the MOSFET is expected to drive a lithium ion cell into thermal runaway, i.e., combustion and rapid venting of cell components. Battery pack design and fire detection and fighting procedures can then be studied to mitigate the risk of an internal short circuit. The variable resistance of the implanted transistor 30 could also be used to investigate the effect of short circuit resistance, i.e., the severity of the short circuit, on the probability of thermal runaway.

Figure 3:
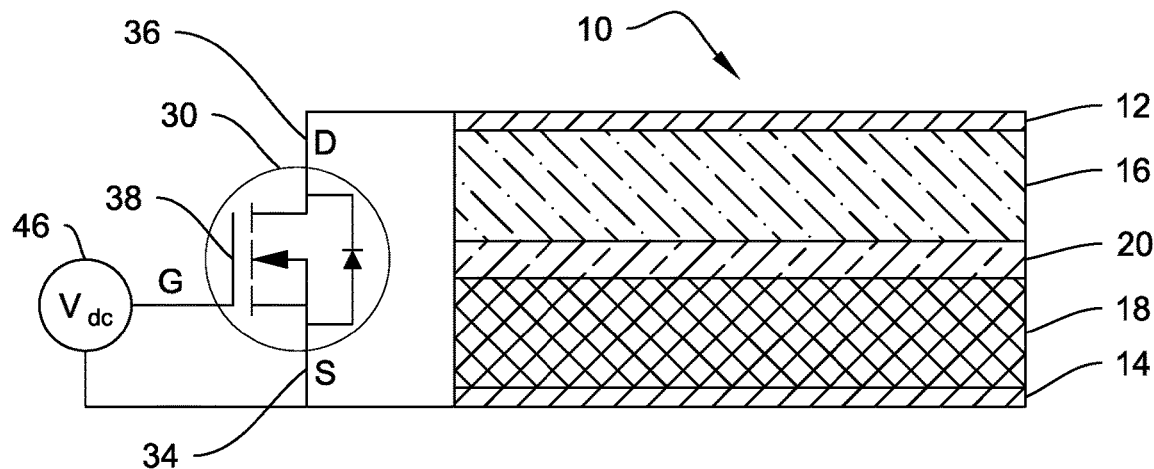
FIG. 3 is a cross-sectional view showing wiring of a FET in a battery according to an embodiment.

FIG. 3 shows a notional wiring diagram for transistor 30 implanted in the electrode structure of a lithium ion battery cell 10. The drawing shows the transistor drain 36 and source 34 are connected to the positive current collector 12 and negative current collector 14, respectively, as a type IV internal short circuit. A variable voltage source 46 is connected between transistor gate 38 and source 34. A voltage applied to gate 38 controls transistor resistance. The directions of electron and Li-ion flow during the short circuit are from source 34 to drain 36. The drain and source leads of the transistor could be insulated or bare and must be stable with respect to cathode voltage during charging.

An example of a transistor that could be used as an implantable internal short circuit trigger is a MOSFET from Vishay Intertechnology (Part number SQSA80ENW). There are a number commercially available MOSFETs that have characteristics that allow implantation in lithium ion batteries. For implantation, the transistor should have a height between 0.2 and 1.0 mm, high power capability (up to 10 A between source and drain), and low resistance (<50 mohms) at low turn on (gate-source) voltages and high operating temperatures (>150° C.). Controlling MOSFET resistance is important for developing internal short circuit detection methods and to investigate the effect of internal resistance (i.e., internal short circuit severity) on Li-ion cell thermal runaway behavior. Further, investigations of thermal runaway propagation through a battery pack could be useful in improving lithium ion battery pack design to mitigate the hazard from a lithium ion cell internal short circuit. To develop the amount of heat required for thermal runaway it might be necessary to wire multiple MOSFETs or other electronic components in parallel.

Other types of transistors other than MOSFETs could be used. The two main types of transistors are field effect transistors (FETs) and bipolar junction transistors (BJTs). FETs are easier to control as a standalone package. BJTs require very precise power sources to control alone and will otherwise require an extra resistor at the emitter to provide similar controllability to a FET.

In more detail, FETs are controlled via voltage input at the gate with little to no current draw. The preferred FETs utilized herein have a low short circuit current sensitivity to input voltage. At the very most, an input voltage of a volt or two will result in around 30 amps. Lower sensitivity is better since it is desirable to control the current as precisely as possible.

BJTs operate on input current into the gate. The amount of input current into the gate is multiplied by roughly 300 times down the short. A short circuit current of 30 A in a BJT translates to an input current of 0.1 A; however, controlling 0.1 A in BJT is difficult. The resistance of the input base is 300 times the resistance at the emitter. The resistance of the BJT emitter will be close to zero since it is essentially shorted straight to ground. This means that after 300 times, the resistance at the input base of the BJT will still be close to 0. This will make it nearly impossible to control for 0.1 A into the base of the BJT. This type of control requires a precise power supply or a resistor at the BJT emitter. However, if controllability isn't required, utilizing a BJT may offer greater short circuit current than a FET.

Figure 4:
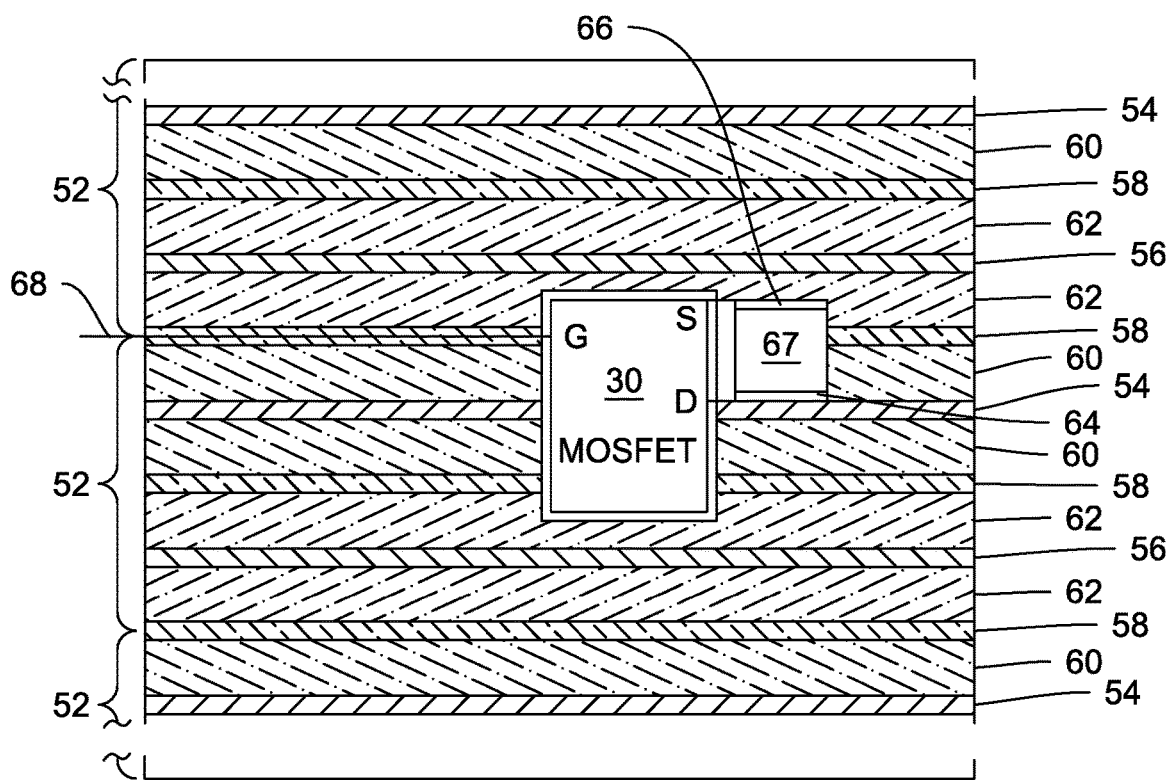
FIG. 4 shows one possible implantation configuration of a transistor in a cell cross-section.

FIG. 4 shows a cross-sectional view of the electrode architecture surrounding an implanted transistor 30 in a multi-layer cell. Each layer 52 consists of a positive current collector 54 (typically aluminum) and a negative current collector 56 (typically copper). Positive current collector 54 is in electrical contact with positive active material 60, and negative current collector 56 is in electrical contact with negative active material 62. Positive active material 60 and negative active material 62 are separated by a porous polymer membrane 58. The collectors 54 and 56 can be metal foils for fast electron transport. Liquid electrolyte permeates the entire electrode structure and supplies Li-ions to the active materials in 60 and 62.

An area of the adjacent layers 52 is cut out in order to accommodate the volume of the transistor 30. A drain lead 64 and a source lead 66 can be placed in the layer structure according to the type of short circuit desired. In one embodiment, leads 64 and 66 can be mounted on a block 67 of a porous, solvent resistant dielectric material (polypropylene, for example) which pushes against the natural compression of the jelly roll. The drawing shows a Type II internal short circuit, i.e., positive collector to negative active layer; however, this could be configured as any of the four types. An electrically insulated gate lead 68 is placed between two layers 52 and protrudes through the cell for an external connection.

Figure 5:
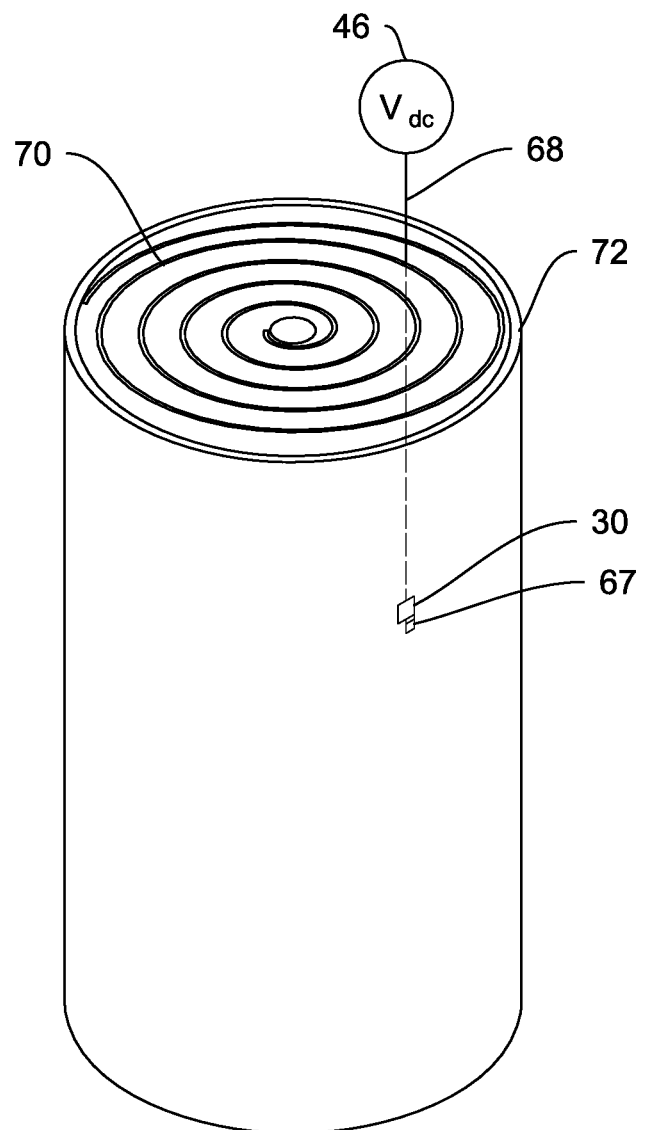
FIG. 5 shows an overview of a transistor positioned in a Li-ion cell.

FIG. 5 shows the layer structure rolled into a jelly roll 70 and positioned in a can 72. After positioning the jelly roll 70 in the can 72 electrolyte can be added. (In use, can 72 will have a sealed lid.) Gate lead 68 extends from transistor 30 to the top of can 72. An aperture can be provided in can 72, and lead 68 can be sealed against can 72. Aperture can be at either end of the can or through a side of the can. In either case, lead should be electrically insulated from the can. In the case of a pouch cell, the lead can protrude through the pouch material.

Before testing and during filling of the cell with electrolyte, the gate lead 68 should be connected to same potential as the source lead until it is desired to trigger thermal runaway. To initiate testing, gate voltage is increased to trigger thermal runaway. Increasing the gate voltage lowers the resistance between the transistor source and drain until the transistor power is high enough to initiate thermal runaway.

To test thermal runaway propagation through a module or battery, a modified cell is placed in a variety of positions within a battery or module of cells and a thermal runaway is initiated. Visual observations, temperature, and voltage data of adjacent cells in the module and other modules can be used to determine the extent of thermal runaway propagation. Having a prepared module allows testing of various mitigation methods. In general, these mitigation efforts focus on absorption and conduction of heat generated by the thermal runaway event and on using a thermal barrier to prevent the abuse from affecting surrounding cells.

Use of an implantable, on-demand internal short circuit inside a Li-ion cell with user controlled resistance allows further investigation of cell and battery faults. Resistance can be controlled to simulate internal short circuits with widely varying resistances including nascent short circuits with high resistance and short circuits near thermal runaway with low resistances. The cell taught herein can be implanted into a battery module to show the effectiveness of an internal short circuit detection method or to calibrate the detection hardware. While this technique was developed for Li-ion battery cells, it could be used as an internal short circuit in any electrochemical power source.

Figure 6A:
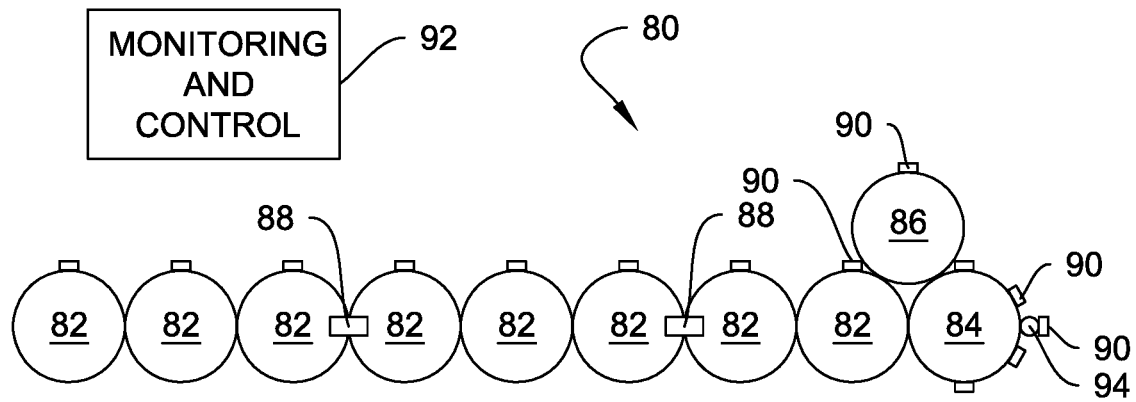
FIG. 6A shows a first test set up for testing a module utilizing a modified cell.
Figure 6B:
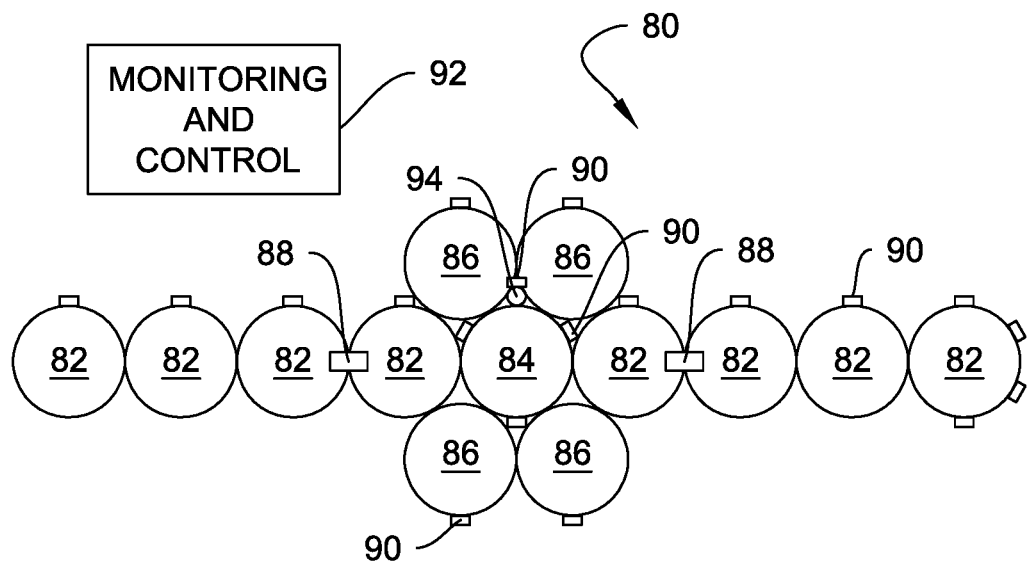
FIG. 6B shows a second test set up for testing a module utilizing a modified cell.

In further detail, FIGS. 6A and 6B show possible monitoring set ups for a large format battery module 80 consisting of single cells 82 connected in a series—parallel arrangement. Parallel-connected cells in a module generally represent a worst case for thermal runaway. All of these cells 82 can contribute to the power through the internal short circuit. Propagation typically begins with the most basic element of the module 80, the parallel string. To test thermal runaway propagation through a parallel string, cells with embedded short circuit devices 84 are typically connected with unmodified cells 82. Some modules 80 include resettable fuses periodically in the parallel string. This fuse is used to interrupt current flow in the parallel string under the event of an external short circuit; however, effect of this type of fuse on internal short circuits is unknown.

This can be tested by positioning modified cells 84 in either an edge position as shown in FIG. 6A or in a middle position as shown in FIG. 6B. The critical distinction between these two setups is the number of adjacent nearest neighbor cells 82 in physical contact with modified cell 84. Extra adjacent cells 86, referred to here as witness cells, can be utilized. Witness cells 86 are not connected electrically to the parallel string containing the modified cell 84 but are included to represent the surrounding cells typical within a module 80. Fuses 88 can be provided between every three cells 82. Thermocouples 90 or other temperature monitoring sensors can be positioned around cells 82, modified cell 84, and witness cells 86. Thermocouples 90 can be electronically connected to monitoring and control equipment 92 by means known in the art. Typically thermocouples or thermistors are used for temperature measurement. The temperature sensor should be in contact with the cell wall typically by taping or adhesion. Monitoring and control equipment can also include infrared sensors to monitor temperatures, and gas sensors to monitor electrochemical combustion gases.

Monitoring and control equipment 92 acquisition rate should be fast enough to capture multiple points along the temperature transient, e.g., on the order of seconds. Monitoring and control equipment 92 should be specific to the type of sensor used. Monitoring and control equipment 92 can also be joined to control the voltage between the gate and source terminals of the transistor in modified cell 84. Control of voltage between the gate and source terminals should be with a high precision source with control at the millivolt level to ensure safety and repeatability of the test. Additional render safe heater cartridges 94 can be included on each module near the modified cell 84 in the event that the transistor in modified cell 84 fails to initiate thermal runaway, or if activation of modified cell 84 does not propagate to neighboring cells.

In the embodiment, shown in FIGS. 6A and 6B, modules are wrapped with one layer of ceramic fiber insulating blanket (e.g., Fiberfrax™) and held in place during testing using glass-fiber tape. Prior to initiation of the internal short circuit, the parallel packs are cycled once at a rate of ~C/8 Charge and C/5 Discharge to confirm capacity and voltage. Cells are typically charged to 100% SOC at 4.2 VDC (including the witness cells, charged separately from the parallel string) prior to propagation testing.

Observations along with gas and temperature measurements are used to determine propagation through the module. Observations that indicate thermal runaway propagation are smoke, fire, or high cell temperature. Propagation typically proceeds from modified cell 84 sequentially through the adjacent cells in the module. It may occur rapidly or there may be a delay in thermal runaway between the cells. Once testing is complete the individual cells can be examined to determine where venting occurred (e.g., side wall, top, or bottom). If thermal runaway does not propagate through the module provisions should be made for discharging the cells to zero state of charge before approaching for disassembly. Once disassembled, capacity measurements of the intact cells can be performed after propagation testing to determine functionality. Care should be taken when handling cells after the test as there may be latent defects that could cause thermal runaway without warning.

The micro transistor concept shown herein gives an embedded internal short circuit with user selectable resistance for triggering thermal runaway in battery cells. This is particularly useful for Li-ion battery cells. This technique does not require the application of external heat. The approach is temperature independent so that applied heat does not complicate interpretation of the test results. Further, the internal short circuit can be triggered over the entire operating temperature range of the cell to determine the effect of temperature on the severity of thermal runaway. Controllable resistance is important for simulating a real world internal short circuit, unlike prior art methods where the state of the short circuit is unknown or binary.

Voltage control of MOSFET resistance allows the internal short circuit severity to be controlled by the user. Other control systems would also be useful for triggering thermal runaway. For example, it might be preferable to initiate thermal runaway after a certain number of charge discharge cycles or at a specific temperature. Micro circuits could be fabricated for implantation along with the micro MOSFET. These could include a charge discharge counter or temperature sensor to switch the MOSFET on after the preset conditions are met. It is possible that the sensor circuitry could be attached to the outside of the cell if there is not enough room inside the jelly roll.

It will be understood that many additional changes in the details, materials, steps and arrangement of parts, which have been herein described and illustrated in order to explain the nature of the invention, may be made by those skilled in the art within the principle and scope of the invention as expressed in the appended claims.

The foregoing description of the preferred embodiments of the invention has been presented for purposes of illustration and description only. It is not intended to be exhaustive, nor to limit the invention to the precise form disclosed; and obviously, many modification and variations are possible in light of the above teaching. Such modifications and variations that may be apparent to a person skilled in the art are intended to be included within the scope of this invention as defined by the accompanying claims.

What is claimed is:

1. A method for testing an internal short circuit comprising the steps of:
   providing an electrochemical cell for testing having a negative active material, a positive active material, a positive current collector, and a negative current collector;
   defining a location for test within the provided electrochemical cell;
   implanting a transistor having a source, a drain, and a gate at the location for test in said electrochemical cell;

electrically joining said transistor source to a controllable voltage source and one of a negative active material and a negative current collector of the electrochemical cell;

electrically joining said transistor drain to one of a positive active material and a positive current collector of the electrochemical cell;

electrically joining said transistor gate to the controllable voltage source;

maintaining said transistor gate at the same voltage as said transistor source utilizing the controllable voltage source before beginning testing;

reducing the electrical resistance between said transistor source and said transistor drain by utilizing the controllable voltage source to change the voltage at said transistor gate to simulate an internal short circuit; and measuring thermal runaway propagation through the cell as electrical resistance is reduced by at least one of measuring a temperature of the electrochemical cell over time, and measuring voltage output of the electrochemical cell over time.

2. The method of claim 1, wherein:

the step of electrically joining said transistor source comprises electrically connecting said transistor source directly to the electrochemical cell negative active material; and wherein the step of electrically joining said transistor drain comprises electrically connecting said transistor drain directly to the electrochemical cell positive active material.

3. The method of claim 1, wherein:

the step of electrically joining said transistor source comprises electrically connecting said transistor source directly to the electrochemical cell negative current collector and insulating said transistor source from said electrochemical cell negative active material; and wherein the step of electrically joining said transistor drain comprises electrically connecting said transistor drain directly to the electrochemical cell positive active material.

4. The method of claim 1, wherein:

the step of electrically joining said transistor source comprises electrically connecting said transistor source directly to the electrochemical cell negative active material; and wherein the step of electrically joining said transistor drain comprises electrically connecting said transistor drain directly to the electrochemical cell positive current collector and electrically insulating said transistor source from said electrochemical cell positive active material.

5. The method of claim 1, wherein:

the step of electrically joining said transistor source comprises electrically connecting said transistor source directly to the electrochemical cell negative current collector and electrically insulating said transistor source from said electrochemical cell negative active material; and wherein the step of electrically joining said transistor drain comprises electrically connecting said transistor drain directly to the electrochemical cell positive current collector and electrically insulating said transistor source from said electrochemical cell positive active material.

6. The method of claim 1, wherein measuring thermal runaway propagation comprises measuring voltage output of the electrochemical cell over time as the electrical resistance is reduced.

7. The method of claim 1, wherein measuring thermal runaway propagation comprises measuring a temperature of the electrochemical cell over time as the electrical resistance is reduced.

8. The method of claim 1, wherein:

the electrochemical cell positive current collector, the electrochemical cell positive active material, the electrochemical cell negative active material, and the electrochemical cell negative current collector are formed in a layered structure; and wherein the step of implanting a transistor comprises the steps of:

forming a cavity in the electrochemical cell layered structure;

providing a transistor in the formed cavity; and providing a gate lead from the transistor gate to the exterior of the electrochemical cell.

9. The method of claim 8, further comprising the steps of:

providing a can for containing the electrochemical cell; and inserting the electrochemical cell in the can by rolling the layered structure after implanting the transistor in the formed cavity and inserting the rolled layered structure in the can.

10. A method for testing an internal short circuit comprising the steps of:

providing the electrochemical cell for testing having a negative active material, a positive active material, a positive current collector, and a negative current collector;

defining a location for test within the provided electrochemical cell;

providing a controllable voltage electrical source;

implanting a transistor having a source lead, a drain lead, and a gate lead at the location for test in said electrochemical cell;

providing a block of a dielectric material;

mounting the source lead and the drain lead on the block;

positioning the block in the electrochemical cell wherein said drain lead is electrically joined to one of the positive active material and the positive current collector of the electrochemical cell, and said source lead is electrically joined to the controllable voltage source and one of the negative active material and the negative current collector of the electrochemical cell;

electrically joining said transistor gate to the controllable voltage source;

maintaining said transistor gate at the same voltage as said transistor source utilizing the controllable voltage source;

reducing the electrical resistance between said transistor source and said transistor drain by utilizing the controllable voltage source to change the voltage at said transistor gate to simulate an internal short circuit; and measuring thermal runaway propagation through the cell as electrical resistance is reduced by at least one of measuring a temperature of the electrochemical cell over time, and measuring voltage output of the electrochemical cell over time.

11. The method of claim 10, wherein the method simulates a type I short circuit by positioning said block between the positive active material and the negative active material whereby the drain lead is in electrical contact with the positive active material and the source lead is in electrical contact with the negative active material.

12. The method of claim 10, wherein the method simulates a type II short circuit by positioning said block between the positive current collector and the negative active material whereby the drain lead is in electrical contact with the positive current collector and the source lead is in electrical contact with the negative active material.

13. The method of claim 10, wherein the method simulates a type III short circuit by positioning said block between the positive active material and the negative current collector whereby the drain lead is in electrical contact with the positive active material and the source lead is in electrical contact with the negative current collector.

14. The method of claim 10, wherein the method simulates a type IV short circuit by positioning said block between the positive current collector and the negative current collector whereby the drain lead is in electrical contact with the positive current collector and the source lead is in electrical contact with the negative current collector.

15. The method of claim 10, wherein the block of dielectric material is porous and solvent resistant.

16. The method of claim 10, wherein the controllable voltage source is positioned outside the electrochemical cell.

* * * * *